(12) United States Patent
Moslehi et al.

(10) Patent No.: US 6,475,359 B1
(45) Date of Patent: Nov. 5, 2002

(54) THIN-FILM PROCESSING ELECTROMAGNET WITH MODIFIED CORE FOR PRODUCING LOW-SKEW MAGNETIC ORIENTATION

(75) Inventors: Mehrdad M. Moslehi, Los Altos, CA (US); Shiyuan Cheng, Richardson, TX (US); Xiangqun Chen, Garland, TX (US); Cecil J. Davis, Greenville, TX (US)

(73) Assignee: CVC Products, Inc., Rochester, NY (US)

( * ) Notice: Subject to any disclaimer, the term of this patent is extended or adjusted under 35 U.S.C. 154(b) by 0 days.

(21) Appl. No.: 09/595,932

(22) Filed: Jun. 16, 2000

Related U.S. Application Data

(62) Division of application No. 09/083,742, filed on May 22, 1998, now Pat. No. 6,106,682.

(51) Int. Cl.⁷ .............................. C14C 14/35; H01F 5/00
(52) U.S. Cl. ........................ 204/298.01; 204/298.16; 204/198.17; 204/198.37; 335/296; 335/297
(58) Field of Search ................................. 335/296–300; 204/298.02, 298.04, 298.15, 298.16, 298.17, 298.37, 298.41

(56) References Cited

U.S. PATENT DOCUMENTS 3,056,341 A * 10/1962 Grey (List continued on next page.)

FOREIGN PATENT DOCUMENTS

| JP | 60-173819 | 9/1985 |
|----|-----------|--------|
| JP | 61161704 | 7/1986 |
| JP | 62232911 | 10/1987 |
| JP | 3056671 | 3/1991 |
| JP | 3-87365 | 4/1991 |

OTHER PUBLICATIONS

Paper entitled "Manufacturing Techniques", pp. 1–28. No Date.

"Ferromagnetic Properties of Films" by Mitchell S. Cohen, M.I.T Lincoln Laboratory, Lexington, Mass., Ch.17, pp. 17–1 thru 17–43. No Date.

"Relation of thickness and some physical properties of NiFe thin films" by R.M. Valletla, G. Guthmiller, and G. Gorman, J. Vac. Sci. Technol. A 9(4) Jul./Aug. 1991 American Vacuum Society, pp. 2093–2098.

*Primary Examiner*—Ramon M. Barrera
(74) *Attorney, Agent, or Firm*—Eugene Stephens & Associates; Thomas B. Ryan

(57) ABSTRACT

An electromagnet having one or more coils wrapped around a plate-shaped core produces a uniaxial magnetic field in the vicinity of a substrate surface for orienting a magnetic film deposited onto the substrate surface. Variations in the magnetic mass of the plate-shaped core or in the magnetic permeability of the core mass are made to reduce angular skew and to improve uniformity of the uniaxial magnetic field. The variations generally involve a reduction in magnetic mass or permeability near a center of the core with respect to a periphery of the core. Cavities of various sizes and shapes but having symmetry with a magnetic axis can be formed in the core for this purpose.

35 Claims, 9 Drawing Sheets

U.S. PATENT DOCUMENTS

| | | |
|---|---|---|
| 3,077,444 A | 2/1963 | Hoh |
| 3,336,154 A | 8/1967 | Oberg et al. |
| 4,032,874 A * | 6/1977 | Kudlacik et al. .............. 336/60 |
| 4,094,764 A | 6/1978 | Boucher et al. |
| 4,155,825 A | 5/1979 | Fournier |
| 4,247,383 A | 1/1981 | Greve et al. |
| 4,404,534 A | 9/1983 | Janvrin ....................... 336/197 |
| 4,581,118 A | 4/1986 | Class et al. |
| 4,595,482 A | 6/1986 | Mintz |
| 4,639,624 A * | 1/1987 | Ejiri et al. .................. 310/154 |
| 4,673,482 A | 6/1987 | Setoyama et al. |
| 4,810,346 A | 3/1989 | Wolf et al. |
| 4,849,250 A | 7/1989 | Dee et al. |
| 4,853,102 A | 8/1989 | Tateishi et al. |
| 4,865,709 A | 9/1989 | Nakagawa et al. |
| 4,871,433 A | 10/1989 | Wagner et al. |
| 4,987,398 A * | 1/1991 | Bessho ....................... 335/299 |
| 5,006,218 A | 4/1991 | Yoshida et al. |
| 5,006,219 A | 4/1991 | Latz et al. |
| 5,026,470 A | 6/1991 | Bonyhard et al. |
| 5,045,166 A | 9/1991 | Bobbio |
| 5,061,838 A | 10/1991 | Lane et al. |
| 5,117,212 A | 5/1992 | Yamamoto et al. ......... 335/210 |
| 5,367,277 A | 11/1994 | Kaidou ....................... 335/229 |
| 5,460,684 A | 10/1995 | Saeki et al. .................. 156/345 |
| 5,612,098 A | 3/1997 | Tan et al. |
| 5,616,370 A | 4/1997 | Okuno et al. |
| 5,630,916 A | 5/1997 | Gerrish et al. |
| 5,858,180 A | 1/1999 | Hsu ..................... 204/192.12 |
| 5,902,466 A | 5/1999 | Gerrish et al. ......... 204/298.16 |
| 6,042,707 A | 3/2000 | Moslehi et al. ........ 204/298.16 |
| 6,051,113 A | 4/2000 | Moslehi ................. 204/192.12 |

* cited by examiner

THIN-FILM PROCESSING ELECTROMAGNET WITH MODIFIED CORE FOR PRODUCING LOW-SKEW MAGNETIC ORIENTATION

Related Applications

This application is a Division of copending application Ser. No. 09/083,742, filed May 22, 1998, now U.S. Pat. No. 6,106,682 by Mehrdad M. Moslehi, Shiyuan Cheng, Xiangqun Chen, and Cecil J. Davis, entitled THIN-FILM PROCESSING ELECTROMAGNET FOR LOW-SKEW MAGNETIC ORIENTATION The parent application is hereby incorporated by reference.

TECHNICAL FIELD

Thin magnetic films deposited (e.g., by physical-vapor deposition processes such as plasma sputtering and ion-beam deposition methods) onto substrates in low-pressure processing environments can be magnetically oriented to a single axis, a condition referred to as "uniaxial anisotropy", by exposing the films to orienting magnetic fields with sufficient field strength that exhibit high magnetic flux uniformity and little angular skew on the substrate during the deposition or subsequent post-deposition processing of the films (such as magnetic annealing processes). Magnetic orientation of thin films can take place in conjunction with various applications including thin-film deposition and thermal anneal processes as well as thin-film magnetic metrology.

BACKGROUND

Thin-film magnetic recording heads are usually fabricated using a combination of material layers including one or more layers of thin soft and hard magnetic films, some of which may have magnetic domains oriented along one or multiple magnetic axes. Generally, the magnetic films are deposited onto substrates in low-pressure processing chambers by physical-vapor deposition (PVD) methods such as plasma sputtering or ion-beam deposition processes. The magnetic domains of these films are oriented by exposing the films to in-plane magnetic fields either during their deposition or during a subsequent processing step such as magnetic annealing. The magnetic fields have specific requirements specifying the upper limits for both "skew" (deviation in direction) and "non-uniformity" (deviation in magnitude). Typical in-plane magnetic field strengths are in the range of 50 to 100 Oersted.

Either permanent magnets or electromagnets can be used for generating the substantially uniaxial magnetic fields. For example, Nakagawa et al. in U.S. Pat. No. 4,865,709 mount thin magnetic film substrates between pairs of permanent magnets on a substrate holder. Opposite poles of the magnets face each other for generating approximately uniaxial magnetic fields across the thin film surfaces of the substrates. However, the permanent magnets are difficult to position, have limited magnetic field strength and adjustability, and are exposed to processing that can affect their long-term performance (resulting, for instance, in long-term field drift). Permanent magnets may also have detrimental effects on the PVD plasma uniformity and repeatability. Moreover, permanent magnets provide no or limited capability for field magnitude or orientation adjustments.

Setoyama et al. in U.S. Pat. No. 4,673,482 position a pair of magnetic field-generating coils on opposite sides of a substrate outside a low-pressure processing chamber in which the substrate is mounted. The coils are located at a considerable distance from the substrate and only a small portion of the resulting magnetic field exhibits the required uniaxial characteristics. Magnetic field adjustability is also limited. Moreover, this type of magnetic field source can produce significant plasma non-uniformity and magnetic interference problems associated with magnetron PVD energy sources.

Co-assigned U.S. Pat. No. 5,630,916 to Gerrish et al., which names one of the inventors of this invention, overcomes many of these problems by positioning a plate-shaped electromagnet adjacent to the substrate positioned over a substrate support. The plate-shaped electromagnet is isolated from the processing environment by the substrate support (i.e., electromagnet located outside the vacuum processing chamber) but is still close to the substrate. The substantially planar plate-shape of the electromagnet, which parallels the substrate, produces a uniaxial field of high uniformity and relatively low skew in the immediate vicinity of the substrate surface. An angularly adjustable support provides for mechanically orienting the plate-shaped electromagnet with respect to the substrate support for fine tuning the magnetic orientation axis.

More recently, tolerances for magnetic field skew (angular deviation from the preferred orientation axis) and non-uniformity have become increasingly stringent and the size of the substrates has become increasingly large (up to 6"×6" square substrates).

Both trends pose similar problems for the available magnetic field orienting equipment. Larger electromagnets can be used to some extent. However, various practical considerations limit the size of the electromagnets. For example, Gerrish et al.'s electromagnet is required to fit within a substrate holder, which is itself limited in size by surrounding vacuum processing chamber dimensions. Unused portions of the magnetic fields produced by the larger magnets beyond the substrate surface area can interfere with substrate processing such as by altering the path of ions to the substrate (thus causing plasma process uniformity degradation) or imbalancing target erosion (e.g., via magnetic field interference with the PVD magnetron energy source).

SUMMARY OF INVENTION

The invention involves modifications to the core of plate-shaped electromagnets (i.e., core engineering) for enhancing the magnetic processing performance of thin films by reducing angular skew and non-uniformity of uniaxial magnetic fields produced by the orienting electromagnets. The modifications include redistributions of magnetic mass or magnetic qualities of the magnetic mass within the electromagnet core. Preferred redistributions take place in patterns that are centered within the core.

The invention can be practiced in various ways including in-situ magnetic orientation in low-pressure PVD (such as plasma sputtering and ion-beam deposition) and in magnetic thermal annealing processing systems. A thin-film processing electromagnet for practicing the invention has a plate-shaped core containing magnetically permeable material. Substantially parallel front and back surfaces of the plate-shaped core are joined by a generally polygonal periphery, and electrically conductive windings are wrapped around a region of the plate-shaped core forming at least one electromagnetic coil for producing a substantially uniaxial magnetic field adjacent to the front surface of the plate-shaped core.

The magnetically permeable material of the plate-shaped core has a mass with an effective magnetic mass density that can vary within the region wrapped by the electrically conductive windings from a center toward the periphery of the plate-shaped core for reducing a skew angle and improving uniformity of the substantially uniaxial magnetic field adjacent to the front surface of the plate-shaped core. The effective magnetic mass variation generally involves a reduction in the mass of the magnetically permeable material near the center of the core with respect to the mass of the magnetically permeable material near the periphery of the core. Also, the magnetic mass variation is preferably patterned with at least one axis of symmetry that extends through the center of the plate-shaped core.

The preferred way of achieving the desired effective magnetic mass variation is by forming a cavity in the plate-shaped core. The cavity can be formed through either the front surface or the back surface of the core, or it can be embedded as a through cavity within the core between the front and back surfaces of the core. Good results have been obtained by centering the cavity within the core and by conforming the peripheral shape of the cavity to the shape of the core periphery. For example, both the cavity and the core periphery can have matching polygonal (e.g., square) shapes.

The magnetically permeable material of the plate-shaped core has an effective magnetic permeability that can also vary within the region wrapped by the electrically conductive windings from a center toward the periphery of the plate-shaped core. The windings are wrapped between two winding planes of the plate-shaped core, and the effective magnetic permeability measured between the winding planes may be varied along the winding planes in a pattern that reduces angular skew and improves uniformity of the uniaxial magnetic field.

Both material composition and geometrical dimensions of the core can affect the effective magnetic permeability measured between or within the winding planes. For example, the core can include a variation in the concentration of a single magnetic material or in the distributions of more than one magnetic material. A cavity reduces the effective magnetic permeability between winding planes by creating a gap that can be left empty or filled by either a non-magnetic material or a lower magnetic permeability material.

DRAWINGS

DETAILED DESCRIPTION

Figure 1:
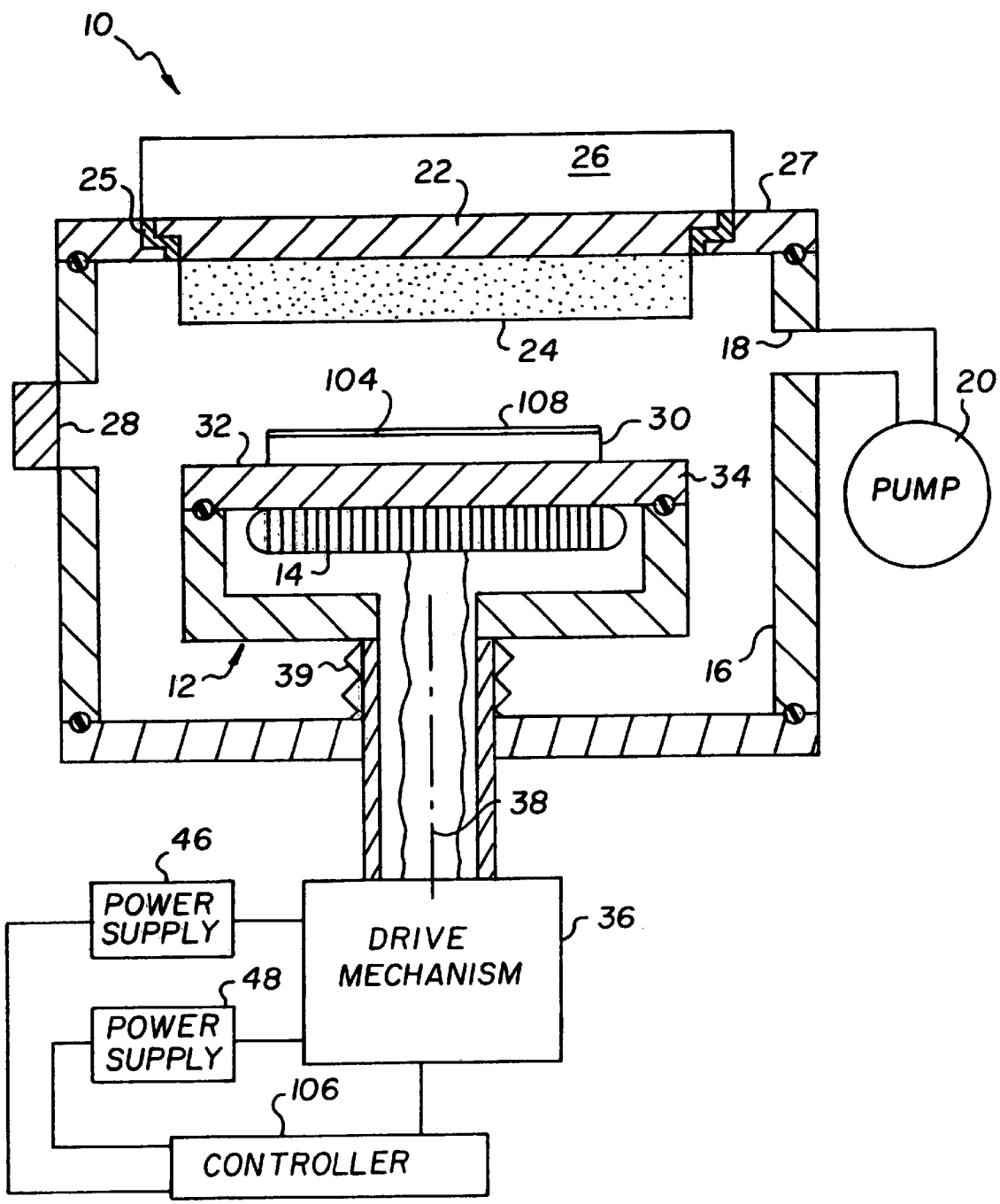
FIG. 1 is a cross-sectional schematic view of a low-pressure PVD processing chamber having a plate-shaped electromagnet for magnetically orienting thin films on a substrate.
Figure 2:
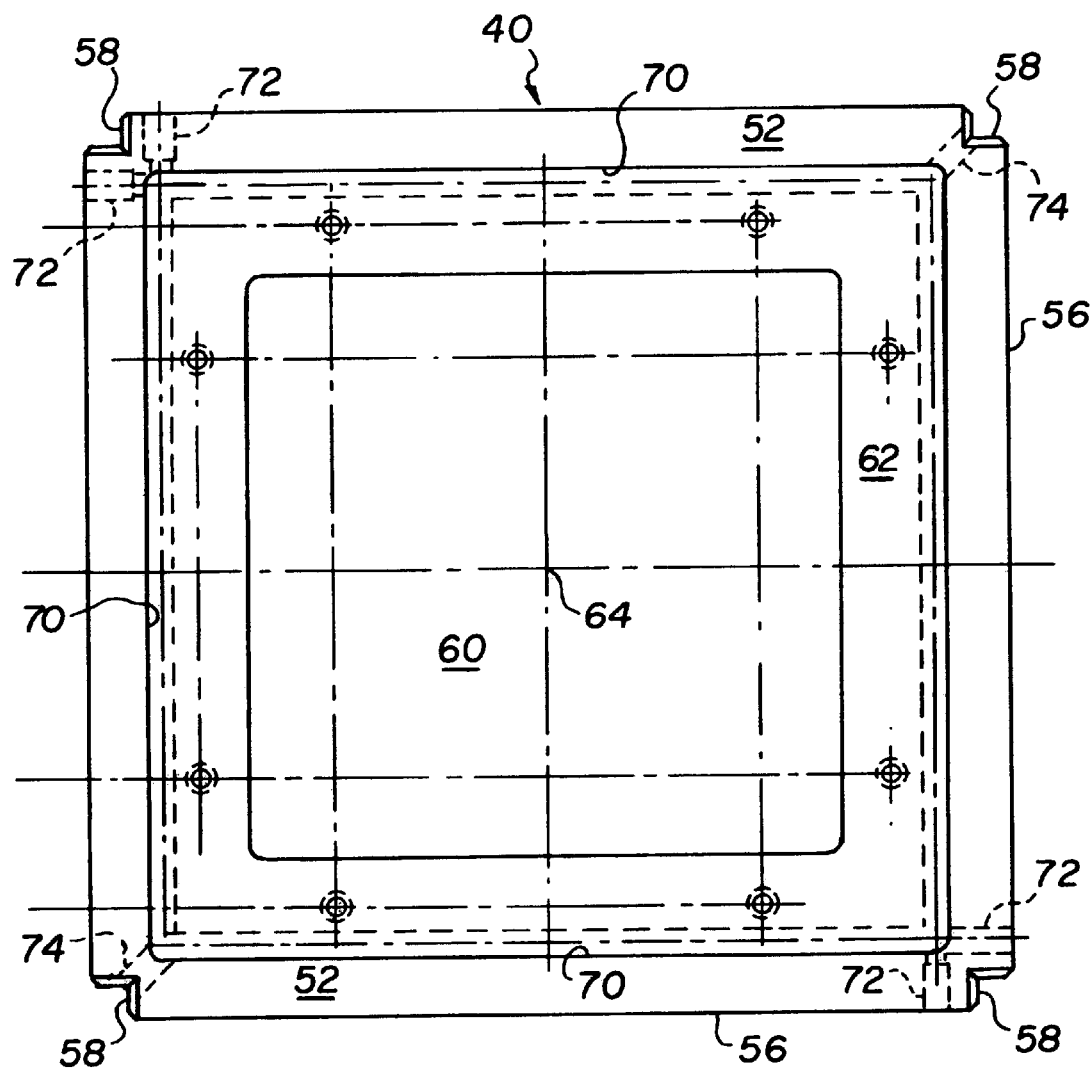
FIG. 2 is a plan view of a plate-shaped core of the electromagnet.
Figure 3:
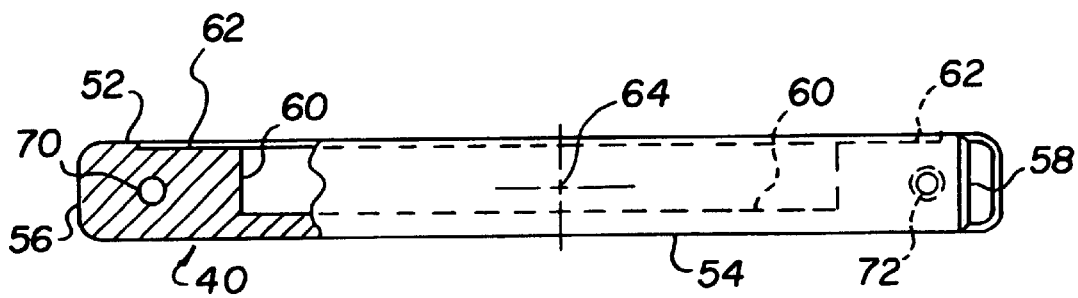
FIG. 3 is a partially cut-away side view of the plate-shaped core of FIG. 2.
Figure 4:
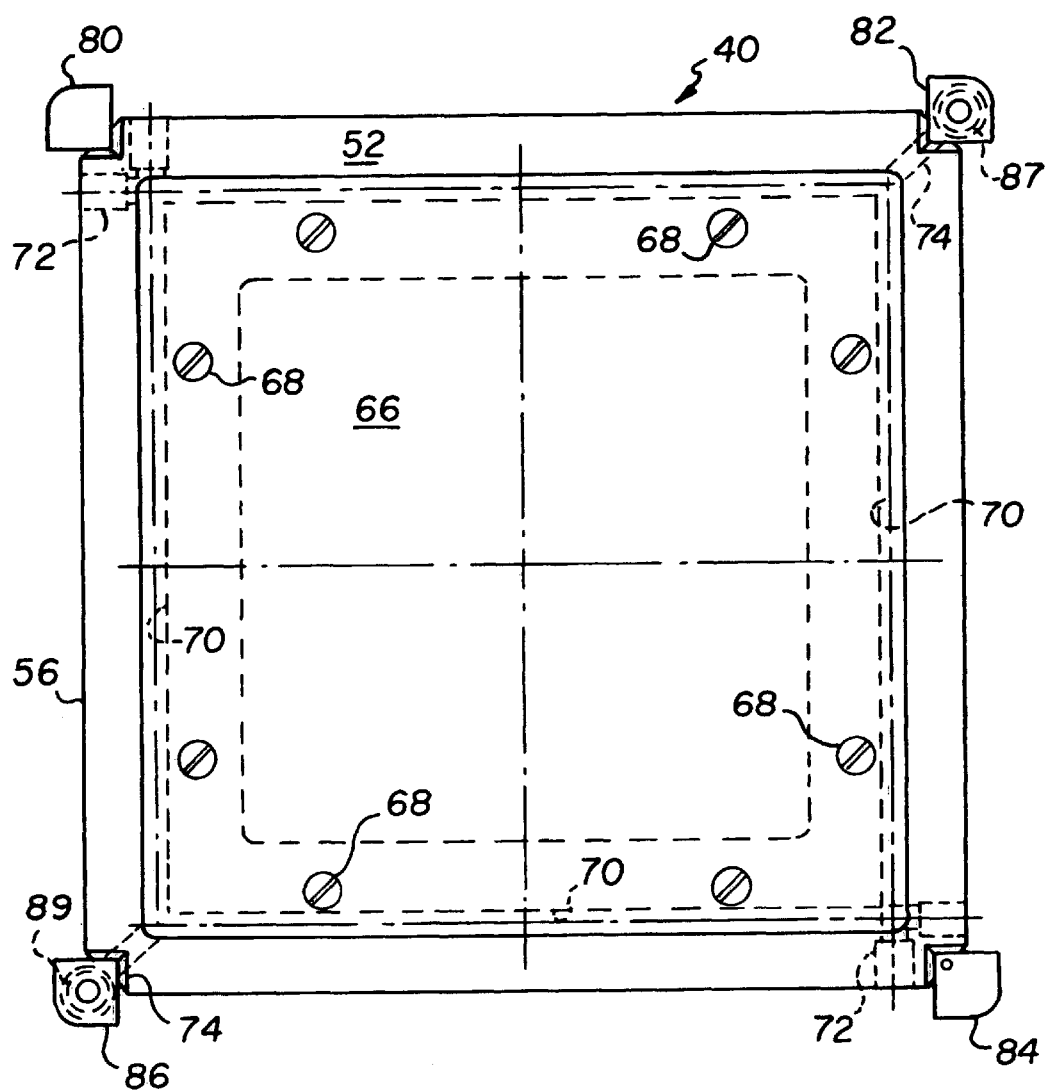
FIG. 4 is a plan view of the same plate-shaped core with the addition of four magnetically permeable corner posts and a cover plate (non-magnetic cavity filler).
Figure 5:
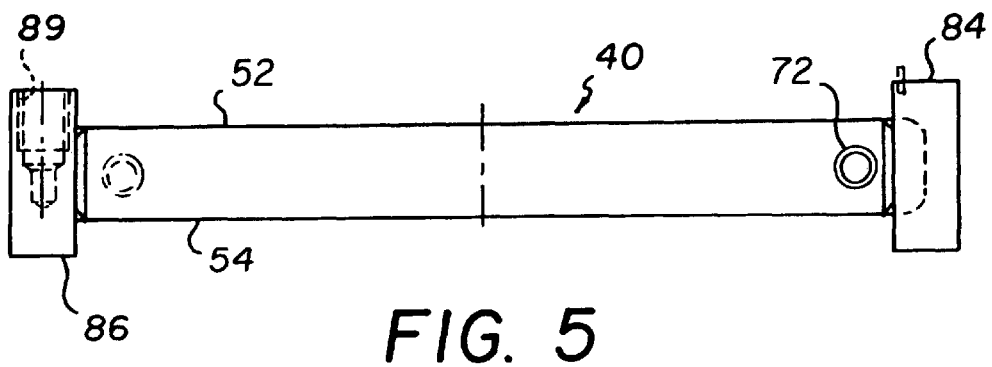
FIG. 5 is a side view of the same core and corner posts.
Figure 6:
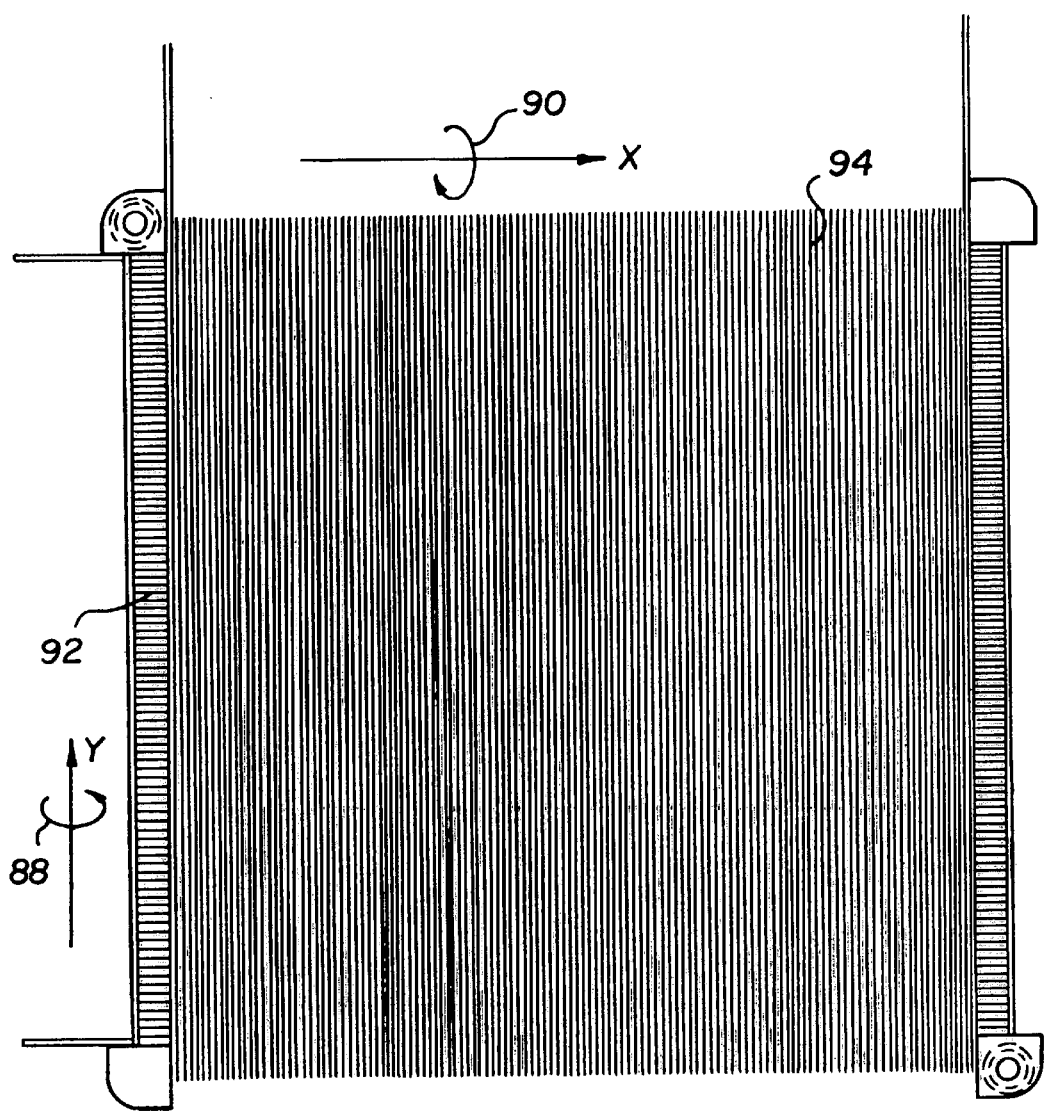
FIG. 6 is a plan view of the electromagnet showing first winding layers of two coils wrapped in orthogonal directions (coil axes 90° apart) around the plate-shaped core.
Figure 7:
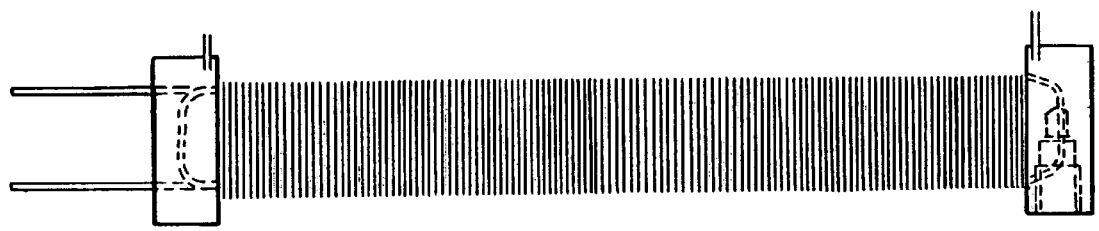
FIG. 7 is a side view of the plate-shaped electromagnet with two winding layers.
Figure 8:
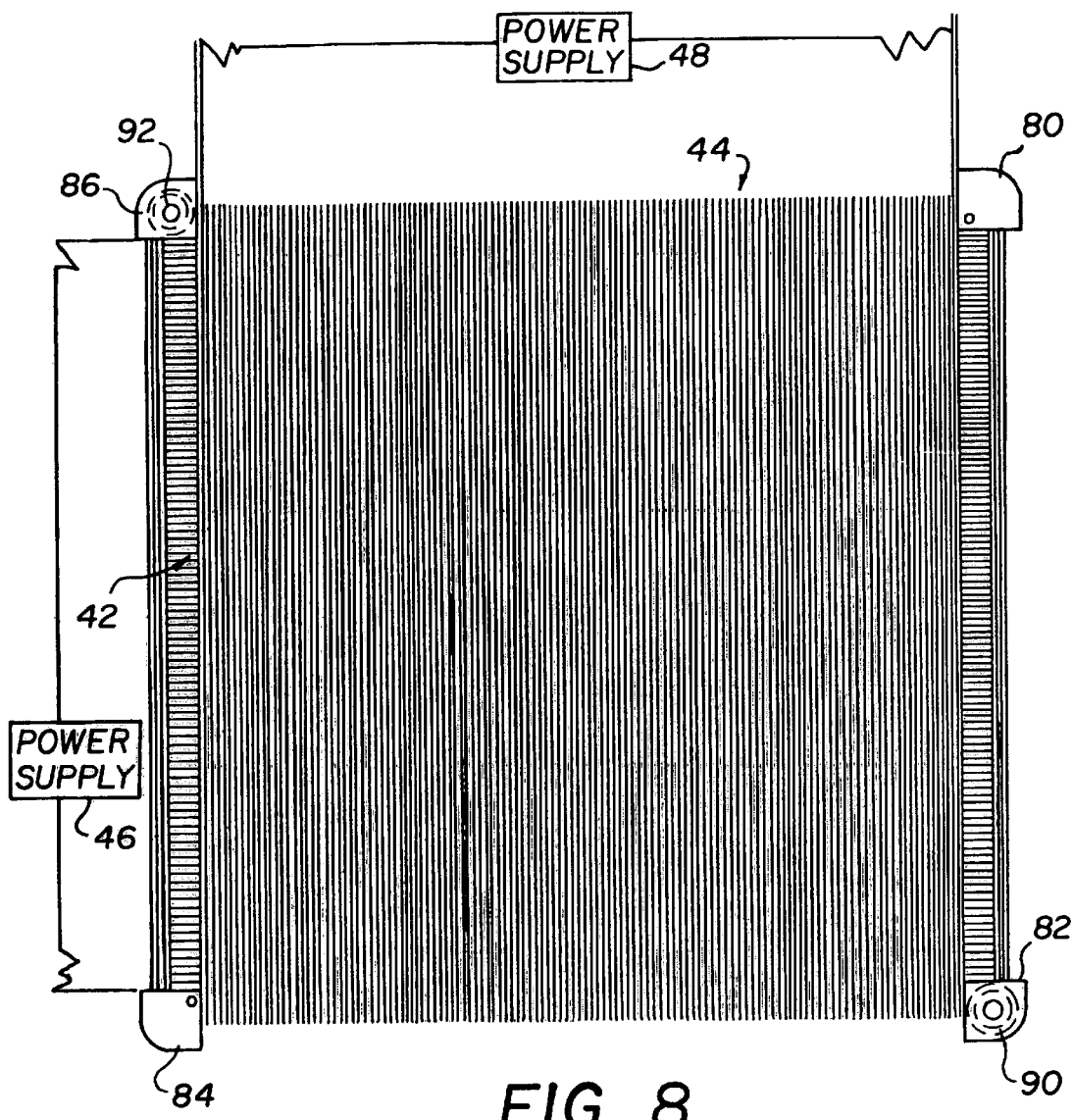
FIG. 8 is a plan view of the electromagnet showing six winding layers divided between the two orthogonal coils and separate (DC or AC) power supplies for energizing the coils.
Figure 9:
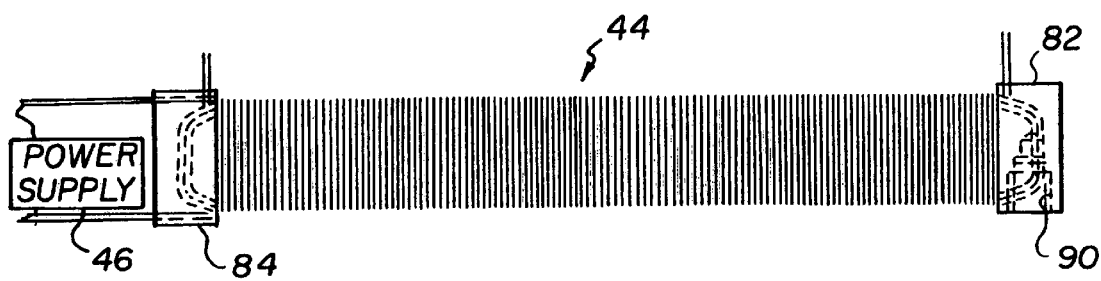
FIG. 9 is a side view of the electromagnet with six winding layers (The winding layers for the orthogonal coils are alternately staggered.).

Benefits of this invention for thin-film processing can be obtained either during the deposition of the thin film (e.g., PVD operations) or during subsequent processing of the film (e.g., thermal annealing operations such as plasma sputtering and ion-beam deposition). FIG. 1 depicts exemplary sputtering apparatus 10 for depositing thin films using a sputtering target. Within a chuck assembly 12 of the sputtering apparatus 10 is a plate-shaped electromagnet 14, which is specially designed and built in accordance with the invention.

Conventional features of the sputtering apparatus 10 used for thin-film deposition processes include a low-pressure processing chamber 16 having an outlet port 18 connected to a vacuum pump 20 for evacuating air and plasma process gases from the chamber 16. Opposite to the chuck assembly 12 is an electrode or backing plate 22 supporting a target 24 of a material such as a soft or hard magnetic material, such as ferromagnetic alloys including NiFe, FeTaN, FeAlN, FeCrHfN, NeFeRe, Sendust, and Copt. A magnetron 26 provides electrical energy and regulates erosion of the target 24 during sputtering operations. The magnetron source 26 may be a DC magnetron or RF magnetron PVD energy source. Moreover, a non-magnetron energy source, such as RD diode, may also be used. The backing plate 22 receives the electrical power for target sputtering and is electrically isolated from a vacuum lid 27 using an insulating ring 25. An access valve 28 provides a resealable opening for moving a substrate 30 into and out of the chamber 16 (e.g., using a cluster tool central water handler).

The substrate 30 is supported on a mounting surface 32 of the chuck assembly 12. The mounting surface 32 is part of a mounting table 34 that can be arranged to regulate substrate temperature. For example, the table 34 can incorporate a heating unit, a cooling unit, or both. Heat exchanges between the table 34 and the substrate 30 can be facilitated by a heat-transfer gas. More detailed examples of chuck assemblies for regulating substrate temperature are found in commonly assigned U.S. patent application Ser. No. 08/938,293, filed Sep. 26, 1997, entitled "Two-Stage System for Thermally Conductive Chuck" and U.S. patent application Ser. No. 08/975,626, filed Nov. 21, 1997, entitled "Thermally Conductive Chuck for Vacuum Processor", both of which are hereby incorporated by reference. Moreover, the chuck assembly 12 may also provide a capability for electrical biasing such as RF biasing of the substrate.

A drive mechanism 36 provides for translating the chuck assembly 12 along an axis 38 toward or away from the target 24 in order to control the substrate-to-target spacing. Bellows 39 seal the chuck assembly 12 to the processing chamber 16 to accommodate a range of chuck assembly translation heights and to isolate the atmospheric components of the chuck assembly 12, including the new plate-shaped electromagnet 14, from the evacuated space of the processing chamber 16. Co-assigned U.S. Pat. No. 5,630,916 describes a plate-shaped electromagnet of a type that can be modified in accordance with the invention, the relevant details of which are also incorporated by reference.

The new plate-shaped electromagnet 14, which is further illustrated in various stages of assembly by FIGS. 2–9, includes a plate-shaped core 40 and two coils 42 and 44 that are alternately wrapped around the core 40 in preferentially orthogonally related and oriented directions. Separate power supplies 46 and 48 control the flow of electrical current through the coils 42 and 44 (if necessary, a single power supply with current-partitioning circuitry can be used). The plate-shaped core 40 (shown best in FIGS. 2–5) has generally square front and back surfaces 52 and 54 that are oriented substantially parallel to each other and joined by a periphery 56 that is interrupted by notches 58 in each of four corners of the square-shaped core. The plate-shaped core 40 is preferably made of a single piece of a magnetically permeable material, such as a Ni-Fe alloy (permalloy), iron, or cold rolled magnetic steel.

Two relatively stepped recesses 60 and 62 are formed through the front surface 52 of the core 40. Both recesses 60 and 62 have square shapes that are centered within the core 40 and have sides oriented parallel to the sides of the core periphery 56. The recess 60 extends most of the way through the core 40 for significantly reducing the amount of magnetic mass near and around a center 64 of the core 40 with respect to the amount of magnetic mass near the core periphery 56. The recess 62 provides space for nesting the windings and mounting a cover-plate 66 of non-magnetic material flush with the front surface 52 of the core 40 for supporting the windings 42 and 44. Screws 68 hold the cover plate 66 in place.

Also formed within the plate-shaped core 40 are intersecting coolant (either compressed air or water cooling) passages 70 that are gun drilled into the core 40 and fitted with plugs 72 to close superfluous openings. Diagonal passages 74 provide the only remaining inlet and outlet openings. Nickel plating or other coatings can be used to protect the passages 70 and 74 from corrosive interactions with a liquid coolant such as water. Access can also be provided for air or liquid coolant circulation within the recess 60. A non-magnetic block (not shown) with connecting passages can also be provided for further enhancing the dissipation of heat from the electromagnet 14. For example, a copper block with circulating passages can be added to withdraw excess heat from higher power operations of the electromagnet 14 (e.g., magnetic field strength above 200 Oersteds).

Corner posts 80, 82, 84, and 86 mate with notches 58 formed in corners of the plate-shaped core 40. The corner posts 80, 82, 84, and 86 carry out several functions. For instance, two of the corner posts 82 and 86 include ports 87 and 89 for coupling coolant lines (not shown) to the diagonal passages 74 in the core 40. Locating the ports 90 and 92 in the corner posts 82 and 86 avoids interrupting the electromagnetic coils 42 and 44 and disrupting their associated magnetic fields.

The corner posts 80, 82, 84, and 86 also function as flanges for confining the electromagnetic coils 42 and 44 on the core 40 and as field shapers for reducing skew and controlling uniformity of the resulting magnetic field across the substrate 30. In their capacity as field shapers, the corner posts 80, 82, 84, and 86 are made of a magnetically permeable material, such as iron. Increases in the height and mass of the corner posts 80, 82, 84, and 86 have been found to progressively reduce field skew. However, field uniformity reached an optimum at a limited height.

A first winding layer 92 of the electromagnetic coil 42 (best seen in FIGS. 6 and 7) is wrapped around the core 40 in a first angular direction 88 taken around an axis "Y", and a first winding layer 94 of the electromagnetic coil 44 is wrapped around both the first winding layer 92 of the electromagnetic coil 42 and the core 40 in a second angular direction 90 taken around an axis "X". Second and succeeding winding layers (shown in FIGS. 8 and 9) of the two electromagnetic coils 42 and 44 are alternately wrapped over each other in the two angular directions 88 and 90. The two axes "X" and "Y" are preferably orthogonal axes which are 90° apart; but other angular relationships are also possible, particularly for other core shapes.

Figure 10:
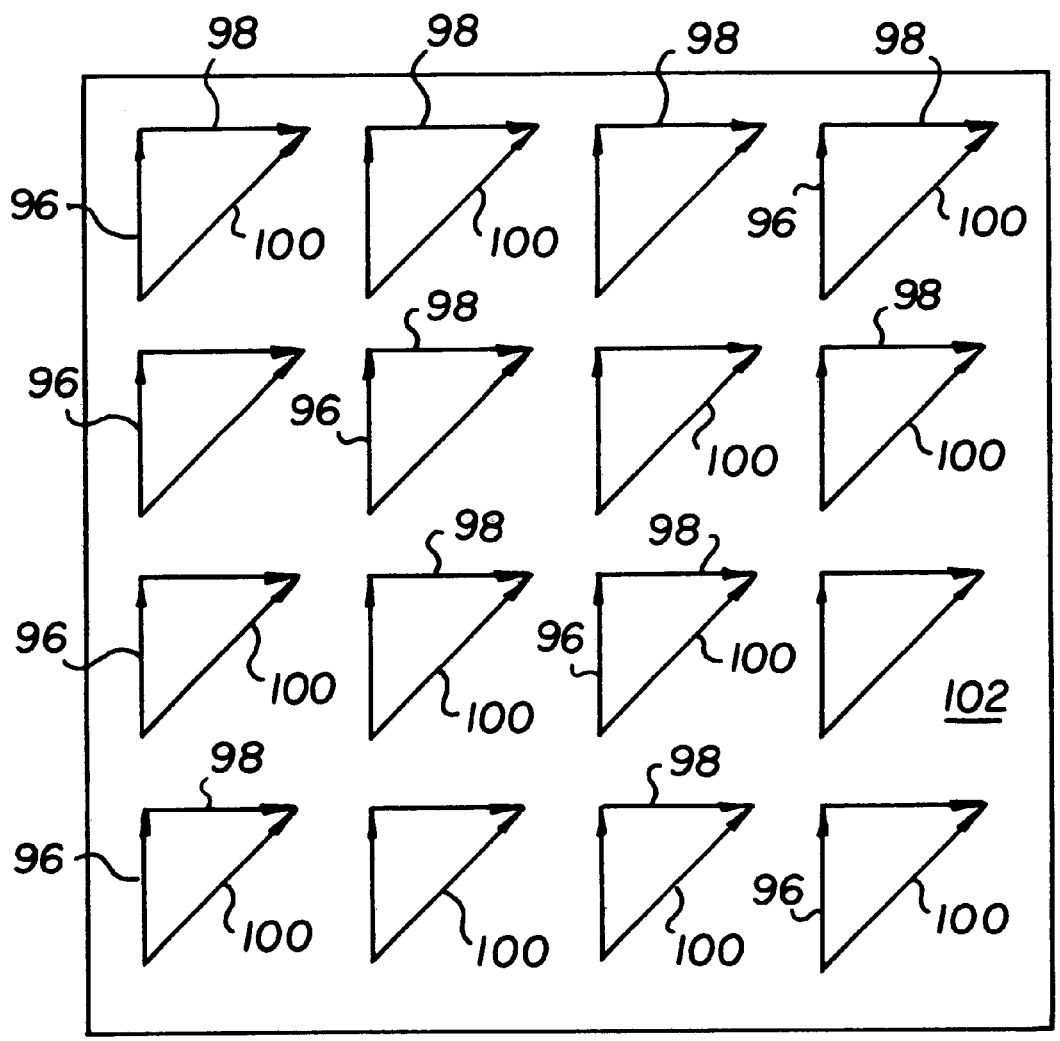
FIG. 10 is a diagram showing respective magnetic fields independently produced by the two orthogonal coils along with a compound (vector sum) magnetic field produced together by powering the two coils using electrical currents.
Figure 10:
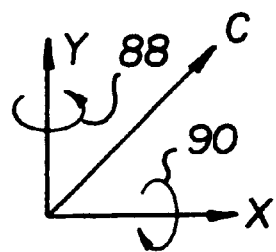

Referring to FIG. 10, which references a plane 102 tangent to a surface 104 of the substrate 30, the electromagnetic coil 42 produces a uniaxial magnetic field 96 that extends parallel with the "Y" axis in the plane 102. The electromagnetic coil 44 produces a similar uniaxial magnetic field 98 that extends parallel with the "X" axis in the plane 102. Together, the two magnetic fields 96 and 98 sum to produce a compound uniaxial magnetic field 100 that extends parallel with a compound axis "C" in the plane 102 (corresponding to the vector sum of the two orthogonal field components).

A controller 106, shown in FIG. 1, regulates outputs of the two power supplies (or the two electrical current drive channels) 46 and 48 to adjust relative amounts of current delivered to the two electromagnetic coils 42 and 44. The electrical currents delivered to the two electromagnetic coils are preferably produced by at least one power source (or two power sources) with relatively low-frequency AC (e.g., frequency between 0.1 Hz and 5 Hz square wave output) in order to orient the magnetic film without creating process non-uniformity in a plasma-assisted thin-film deposition system. Variations in the ratio of currents conveyed by the two electromagnetic coils 42 and 44 can be used to adjust the angular orientation of the compound axis "C" throughout a continuum of different angular positions 0° to 360° between the four quadrants of the plane defined by the "X" and "Y" axes. For example, if the electromagnetic coil 42 receives all of the current, then the compound axis "C" is oriented coincident with the "Y" axis; if the electromagnetic coil 44 receives all of the current, then the compound axis "C" is oriented coincident with the "X" axis; and if both electromagnetic coils 42 and 44 receive a share of the current, then the compound axis "C" includes components along both the "X" and "Y" axes that are combined having regard to their direction and magnitude (i.e., by vector addition) to orient the compound axis "C" in a new and known angular position.

The compound uniaxial magnetic field 100 preferably exhibits minimum variations in angular direction (skew) and magnitude (uniformity) throughout the working area of the substrate surface 104. To achieve these goals, the plate-shaped core 40 is preferably sized as large as possible within the allowable confines of the chuck assembly 12 and the low-pressure processing chamber 16 and is preferably positioned relatively close to the substrate 30 (e.g., the electromagnet core to the substrate spacing is a small fraction of the diagonal dimension of the electromagnet).

A magnetic film 108 on the substrate surface 104 can be magnetically oriented to a given angular position of the compound magnetic axis "C" by regulating the relative amounts of current that are directed through the two electromagnetic coils 42 and 44. Preferably, the total current is divided in a fixed ratio between the electromagnetic coils 42 and 44 to maintain the compound magnetic axis in a fixed angular position throughout the deposition or subsequent treatment of the magnetic film in the processing chamber 16. However, the current can be divided in the same or different ratio during the deposition or treatment of a succeeding layer of magnetic film (not shown) for orienting magnetic domains of the film along the same or a differently oriented compound magnetic axis "C". The magnetic field may be a static uniaxial magnetic field (produced using fixed drive currents) for uniaxial orientation of the magnetic thin film or a dynamically rotating (or oscillating) magnetic field for eliminating any preferred orientation of the deposited film.

The same plate-shaped core 40 could also be wrapped with just one of the coils 42 or 44 to provide a single axis ("X" or "Y") of magnetic orientation with respect to the core 40. Three or even more than three angularly related coils could also be used to further improve field uniformity and alignment throughout ranges of angular orientations of the magnetic field. The additional coils are preferably mounted on plate-shaped cores having polygonal peripheries with more than four sides. Examples are illustrated by the next two drawing figures.

Figure 11:
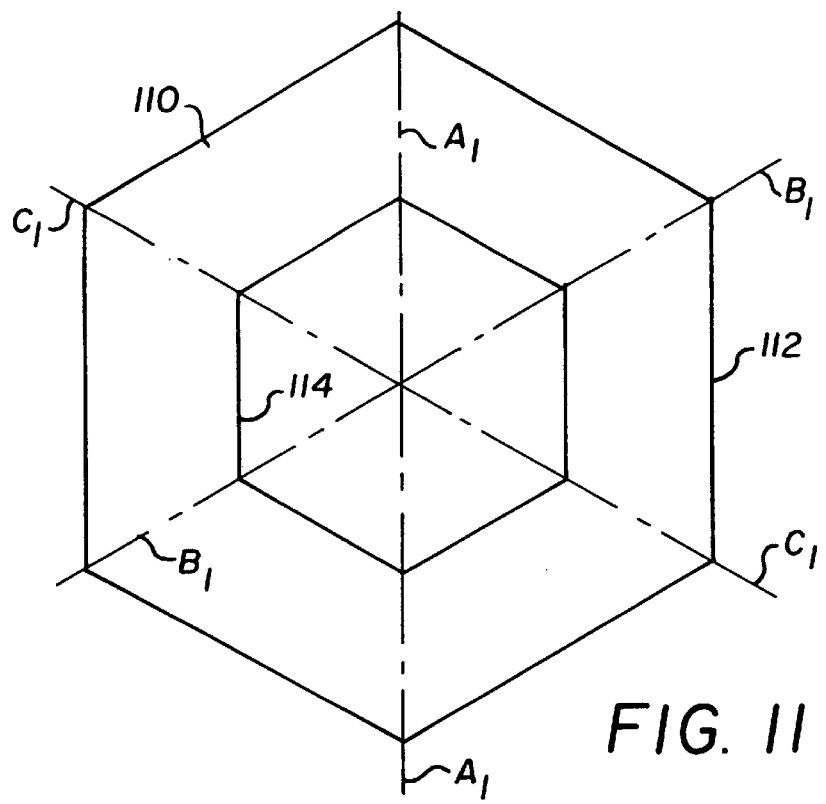
FIG. 11 is a schematic plan view of an alternative electromagnet having three coil axes and a plate-shaped core with a hexagonal periphery and a conforming center cavity.

A plate-shaped core 110 having a hexagonal periphery 112 and a conforming hexagonal cavity 114 is illustrated by FIG. 11. Both the hexagonal periphery 112 and the hexagonal cavity 114 are symmetric about three winding axes "$A_1$", "$B_1$", and "$C_1$". For clarity, the actual windings are not shown. More or less than three angularly related windings can be supported by the plate-shaped core 110. For example, three additional windings could be mounted along axes that bifurcate the core sides (The windings can be supported by parallel sides.).

Figure 12:
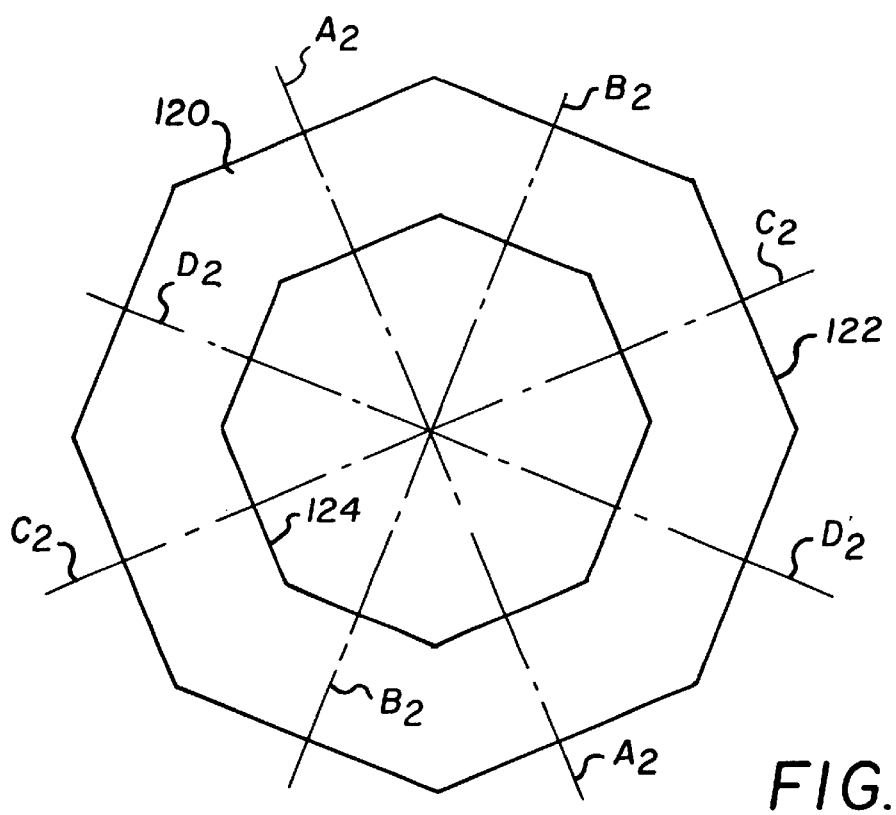
FIG. 12 is a schematic plan view of an alternative electromagnet having four coil axes and a plate-shaped core with an octagonal periphery and a conforming center cavity.

FIG. 12 illustrates a plate-shaped core 120 having an octagonal periphery 122 and a conforming octagonal cavity 124. Four winding axes "$A_2$", "$B_2$", "$C_2$" and "$D_2$" bifurcate the eight sides of the core 120. More sides up to a circular periphery with a conforming circular core could be used to support more windings or windings in different angular relationships.

Figure 13:
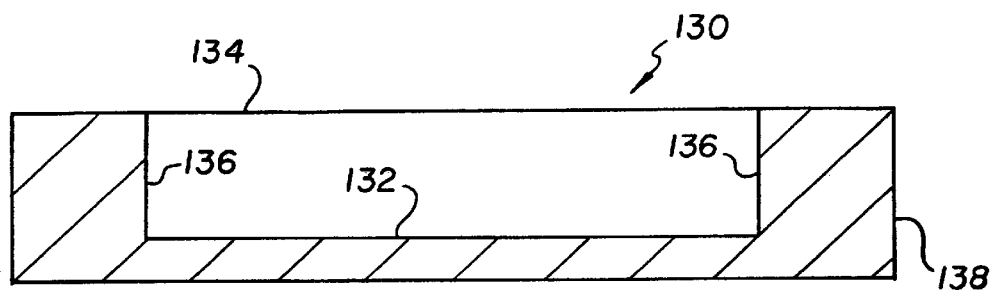
FIG. 13 is a schematic cross-sectional view of a plate-shaped core having a recess formed in a front surface (The recess forms a non-through center cavity.).

FIGS. 13–18, show some of the cross-sectional variation in cavity design intended for reducing magnetic mass near the center of plate-shaped cores. In FIG. 13, a plate-shaped core 130, similar to the more detailed plate-shaped core 40 of FIGS. 2–5, includes a cavity 132 formed through a front surface 134. The cavity 132 has shear sidewalls 136 that make abrupt variations in magnetic mass approaching a periphery 138 of the core 130.

Figure 14:
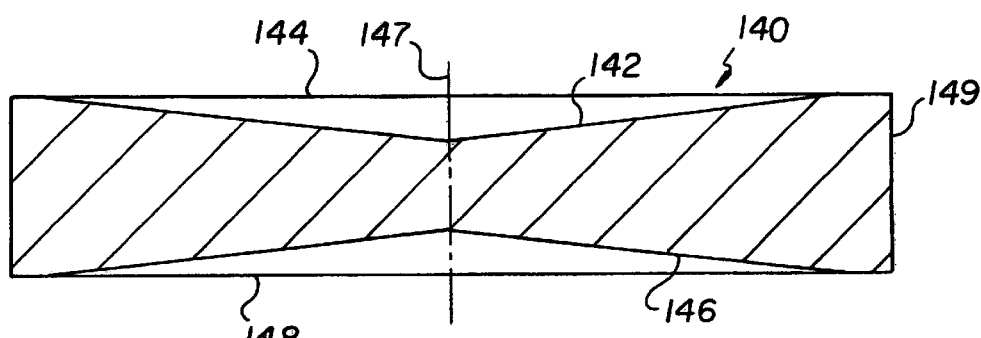
FIG. 14 is a schematic cross-sectional view of a plate-shaped core having tapered or graded recesses formed in both front and back surfaces.

The plate-shaped core 140 of FIG. 14 includes a first cavity 142 formed in a front surface 144 and a second cavity 146 formed in a back surface 148. In comparison to the cavity 132 of FIG. 13, the cavities 142 and 146 provide a more gradual variation in magnetic mass from a center 147 toward a periphery 149 of the core 140. The more gradual core mass variation may improve magnetic field uniformity in conjunction with reduced skew.

Figure 15:
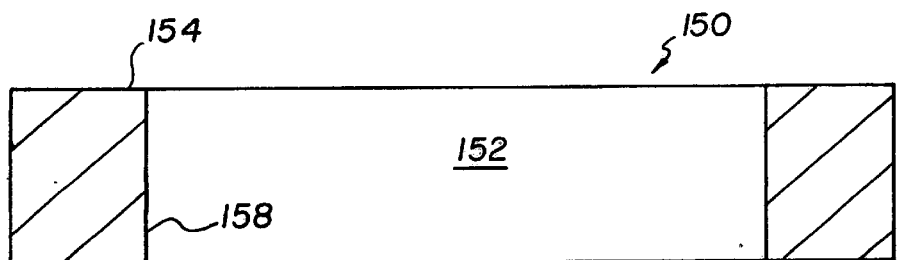
FIG. 15 is a schematic cross-sectional view of a plate-shaped core having a recess formed entirely through the core (through-hole cavity).
Figure 16:
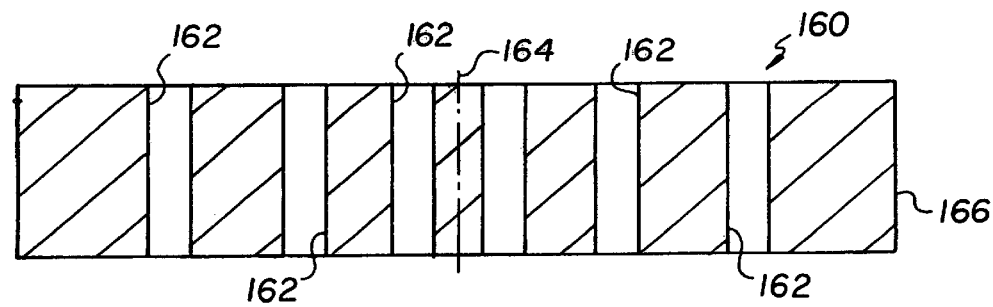
FIG. 16 is a schematic cross-sectional view of a plate-shaped core having a plurality of recesses or holes formed entirely through the core.

FIGS. 15 and 16 depict examples of cavities that are formed entirely through plate-shaped cores. For example, a plate-shaped core 150 in FIG. 15 includes a cavity 152 that extends through an entire thickness of the core 150 between front and back surfaces 154 and 156. Sidewalls 158 of the cavity 152 extend normal to the front and back surfaces 154 and 156 but could be inclined at other angles to make a more gradual mass variation.

A plurality of cavities 162 are formed entirely through a plate-shaped core 160 illustrated in FIG. 16. More of the cavities 162 are concentrated near a centerline 164 than near a periphery 166 of the core 160 to provide the desired magnetic mass variation.

The plurality of cavities can be made with different shapes and sizes or can extend only part way through the core 160. Spiral or other continuous cavity patterns can also be used including patterns appropriate for circulating or conveying coolant.

Figure 17:
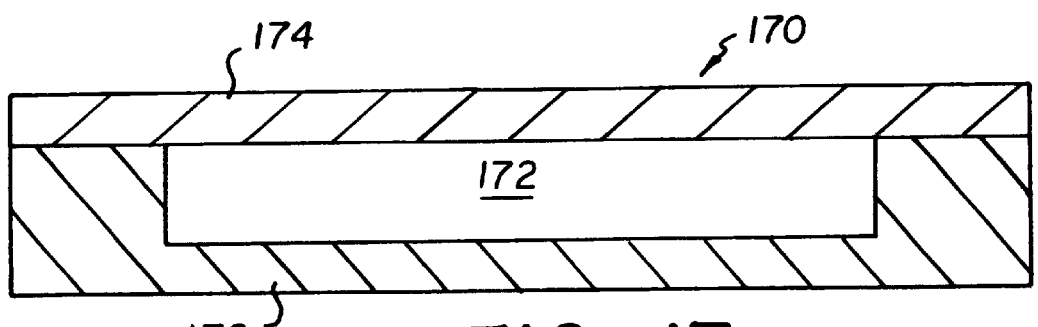
FIG. 17 is a schematic cross-sectional view of a plate-shaped core having a recess or non-magnetic cavity embedded within the core.
Figure 18:
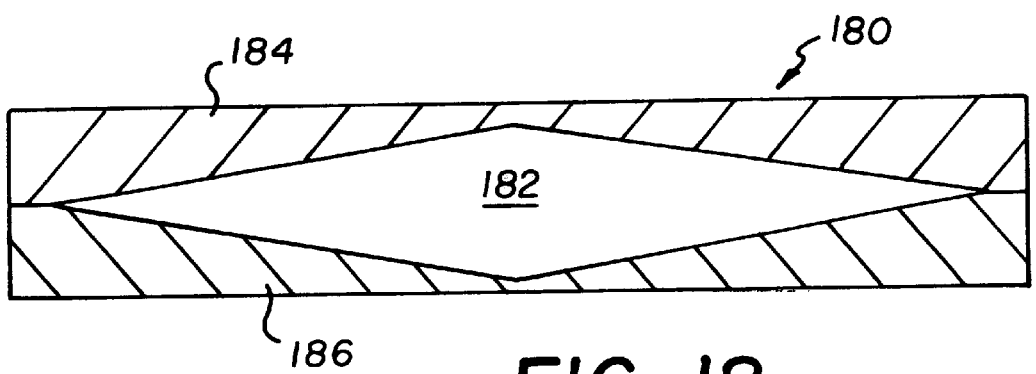
FIG. 18 is a schematic cross-sectional view of a plate-shaped core having a tapered recess or graded cavity embedded within the core.

Plate-shaped cores 170 and 180 of FIGS. 17 and 18 include respective cavities 172 and 182 that are completely embedded within the cores 170 and 180. To facilitate manufacture, the core 170 is divided into two core plates 174 and 176, and the core 180 is divided into two core plates 184 and 186. The magnetic mass variation along the core 170 can be represented by a step function similar to the magnetic mass variations of the cores shown in FIGS. 13 and 15–17. A continuous function describes the magnetic mass variation along the core 180, which is similar to the magnetic mass variation of the core from FIG. 14.

Any of the core cavities described thus far can be filled with air, a non-magnetic material, or a lower magnetically permeable material. The space can also be used for other purposes such as conveying coolant. Instead of forming a cavity within the plate-shaped cores, the magnetic properties of a single magnetic material or a mix of magnetic materials can be varied in a stepwise or continuous fashion to provide a similar variation in effective magnetic mass or in the magnetic permeability of the mass.

Figure 19:
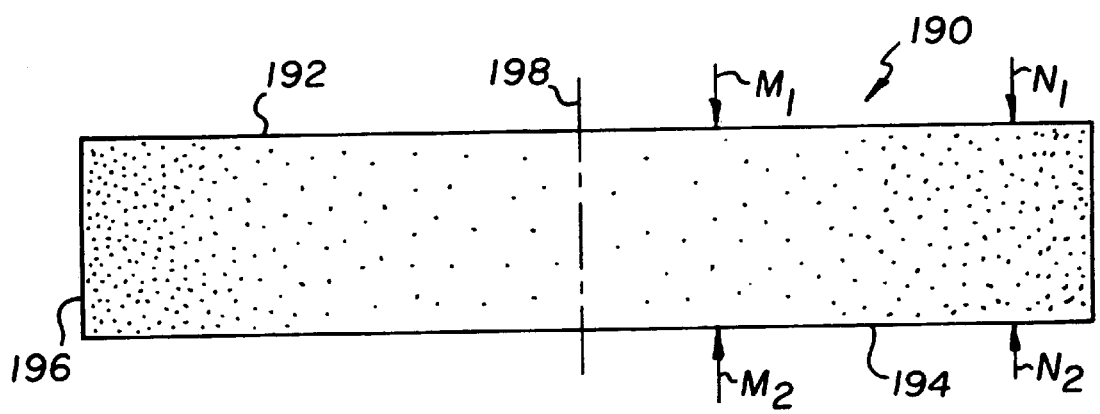
FIG. 19 is a schematic cross-sectional view of a plate-shaped core having a concentration of magnetic material.

For example, a plate-shaped core 190 illustrated by FIG. 19 has a similar outline as the preceding embodiments including front and back surfaces 192 and 194 joined by a periphery 196. However, a concentration of magnetic material (or the effective magnetic permeability) varies from a minimum near a center 198 to a maximum near the periphery 196.

The front and back surfaces 192 and 194 of the plate-shaped core 190, similar to the front and back surfaces of the earlier described cores, define parallel winding planes through which effective magnetic permeability can be measured. For example, the effective magnetic permeability measured between points "$M_1$" and "$M_2$" near the center 198 is less than the effective magnetic permeability measured between points "$N_1$" and "$N_2$" closer to the periphery 196. Similar affects on the effective magnetic permeability can be achieved by adjusting the depth of cavities or the distribution of magnetic and non-magnetic or lower magnetic materials.

We claim:

1. A thin-film processing electromagnet mounted adjacent to an evacuated processing space of a processing chamber containing a substrate having a magnetic material layer on the substrate for low-skew magnetic orientation of the magnetic material layer on the substrate comprising:

a plate-shaped core containing magnetically permeable material and having front and back surfaces joined by a periphery;

electrically conductive windings wrapped around a region of said plate-shaped core forming at least one electromagnetic coil that produces a substantially uniaxial magnetic field adjacent to said front surface of the plate-shaped core for orienting the magnetic material layer on the substrate;

said magnetically permeable material of the plate-shaped core having an effective magnetic mass that varies within the region wrapped by said electrically conductive windings from a center toward the periphery of the plate-shaped core for reducing skew angle of the substantially uniaxial magnetic field adjacent to the front surface of the plate-shaped core over the entire substrate surface area;

said effective magnetic mass variation involving a reduction in the mass of magnetically permeable material near the center of the core with respect to the mass of magnetically permeable material near the periphery of the core; and said plate-shaped core together with said electrically conductive windings being mounted adjacent to the evacuated processing space of the processing chamber and positioning the uniaxial magnetic field within the processing space in an orientation parallel to the magnetic material layer on the substrate.

2. The thin-film processing electromagnet of claim 1 in which said magnetic mass variation has a pattern with at least one axis of symmetry that extends through the center of the plate-shaped core.

3. The thin-film processing electromagnet of claim 2 in which said pattern of magnetic mass variation has two axes of symmetry that intersect substantially at the center of the plate-shaped core.

4. The thin-film processing electromagnet of claim 3 in which said electrically conductive windings of the one coil are wrapped in a first direction that extends parallel to one of said axes of symmetry.

5. The thin-film processing electromagnet of claim 4 in which said electrically conductive windings of another coil are wrapped in a second direction that extends parallel to the other of said axes of symmetry.

6. The thin-film processing electromagnet of claim 2 in which said effective magnetic mass variation is defined by a continuously varying function of position along the axis of symmetry.

7. The thin-film processing electromagnet of claim 2 in which said effective magnetic mass variation is defined by step functions of position along the axis of symmetry.

8. The thin-film processing electromagnet of claim 1 in which said effective magnetic mass variation is produced at least in part by a cavity formed in said plate-shaped core.

9. The thin-film processing electromagnet of claim 8 in which said cavity has a periphery with a closed shape.

10. The thin-film processing electromagnet of claim 9 in which said cavity is substantially centered within said plate-shaped core.

11. The thin-film processing electromagnet of claim 10 in which said cavity has a periphery with a shape that matches a shape of said periphery of the plate-shaped core.

12. The thin-film processing electromagnet of claim 11 in which both said periphery of the plate-shaped core and said periphery of the cavity in said plate-shaped core have polygonal shapes.

13. The thin-film processing electromagnet of claim 12 in which both said periphery of the plate-shaped core and said periphery of the cavity in said plate-shaped core have square shapes.

14. The thin-film processing electromagnet of claim 11 in which both said periphery of the plate-shaped core and said periphery of the cavity in said plate-shaped core have circular shapes.

15. The thin-film processing electromagnet of claim 8 in which said cavity is embedded within said plate-shaped core.

16. The thin-film processing electromagnet of claim 8 in which said cavity is one of a plurality of cavities that perforate said plate-shaped core.

17. The thin-film processing electromagnet of claim 16 in which said plurality of cavities account for a larger removal of core effective magnetic mass near the center of the plate-shaped core than near the periphery of the plate-shaped core.

18. The thin-film processing electromagnet of claim 1 in which said plate-shaped core contains a plurality of different materials that vary in magnetic permeability, and said effective magnetic mass variation is produced at least in part by a variation in the effective magnetic permeability of the plate-shaped core from the center toward the periphery of the plate-shaped core.

19. The thin-film processing electromagnet of claim 18 in which said magnetic permeability is less near the center than near the periphery of the plate-shaped core.

20. The thin-film processing electromagnet of claim 1 in which cooling passages are formed in said plate-shaped core.

21. The thin-film processing electromagnet of claim 20 in which said cooling passages intersect a cavity that contributes to said effective magnetic mass variation.

22. The thin-film processing electromagnet of claim 21 in which said periphery of the plate-shaped core has a plurality of sides separated by intersection corners, and said cooling passages enter and leave said plate-shaped core through at least a subset of said corners.

23. The thin-film processing electromagnet of claim 1 wherein said electromagnet is powered by an alternating current electrical drive current to form an orienting magnetic field along a uniaxial direction.

24. A thin-film processing electromagnet for low-skew magnetic orientation of a magnetic material layer on a substrate comprising:

a plate-shaped core containing magnetically permeable material and having front and back surfaces joined by a periphery;

electrically conductive windings wrapped around a region of said plate-shaped core forming at least one electromagnetic coil for producing a substantially uniaxial magnetic field adjacent to said front surface of the plate-shaped core for orienting the magnetic material layer on the substrate;

said magnetically permeable material of the plate-shaped core having an effective magnetic mass that varies within the region wrapped by said electrically conductive windings from a center toward the periphery of the plate-shaped core for reducing skew angle of the substantially uniaxial magnetic field adjacent to the front surface of the plate-shaped core over the entire substrate surface area;

said effective magnetic mass variation involving a reduction in the mass of magnetically permeable material near the center of the core with respect to the mass of magnetically permeable material near the periphery of the core;

cooling passages being formed in said plate-shaped core;

said cooling passages intersecting a cavity that contributes to said effective magnetic mass variation;

said periphery of the plate-shaped core having a plurality of sides separated by intersection corners, and said cooling passages entering and leaving said plate-shaped core through at least a subset of said corners; and further comprising corner posts located at said corners of the plate-shaped core for providing entry and exit ports for said cooling passages in said plate-shaped core.

25. The thin-film processing electromagnet of claim 24 in which said corner posts are made of a magnetically permeable material and project in height above said front surface of the plate-shaped core for further reducing skew of the substantially uniaxial magnetic field over said substrate surface.

26. A thin-film processing electromagnet for low-skew magnetic orientation of a magnetic material layer on a substrate comprising:

a plate-shaped core containing magnetically permeable material and having front and back surfaces joined by a periphery;

electrically conductive windings wrapped around a region of said plate-shaped core forming at least one electromagnetic coil for producing a substantially uniaxial magnetic field adjacent to said front surface of the plate-shaped core for orienting the magnetic material layer on the substrate;

said magnetically permeable material of the plate-shaped core having an effective magnetic mass that varies within the region wrapped by said electrically conductive windings from a center toward the periphery of the plate-shaped core for reducing skew angle of the substantially uniaxial magnetic field adjacent to the front surface of the plate-shaped core over the entire substrate surface area;

said effective magnetic mass variation involving a reduction in the mass of magnetically permeable material near the center of the core with respect to the mass of magnetically permeable material near the periphery of the core; and wherein said substrate resides in a physical-vapor deposition system.

27. The thin-film processing electromagnet of claim 26 wherein said physical-vapor deposition system is a plasma sputtering system.

28. The thin-film processing electromagnet of claim 26 wherein said physical-vapor deposition system is an ion-beam deposition system.

29. A thin-film processing electromagnet for low-skew magnetic orientation of a magnetic material layer on a substrate comprising:

a plate-shaped core containing magnetically permeable material and having front and back surfaces joined by a periphery;

electrically conductive windings wrapped around a region of said plate-shaped core forming at least one electromagnetic coil for producing a substantially uniaxial magnetic field adjacent to said front surface of the plate-shaped core for orienting the magnetic material layer on the substrate;

said magnetically permeable material of the plate-shaped core having an effective magnetic mass that varies within the region wrapped by said electrically conductive windings from a center toward the periphery of the plate-shaped core for reducing skew angle of the substantially uniaxial magnetic field adjacent to the front surface of the plate-shaped core over the entire substrate surface area;

said effective magnetic mass variation involving a reduction in the mass of magnetically permeable material near the center of the core with respect to the mass of magnetically permeable material near the periphery of the core; and wherein said substrate resides in a magnetic thermal annealing system.

30. A thin-film processing electromagnet mounted adjacent to an evacuated processing space of a processing chamber containing a substrate having a surface and producing a uniaxial magnetic field on the surface of the substrate comprising a plate-shaped core and an electromagnetic coil wrapped between two winding planes of said plate-shaped core; said plate-shaped core exhibiting as a function core dimension an effective magnetic mass between said winding planes that varies along an axis parallel to said winding planes in a pattern that reduces skew of the uniaxial magnetic field; said effective magnetic mass varying between a center and a periphery of said plate-shaped core; said effective magnetic mass being reduced at said center of the plate-shaped core with respect to said periphery of the plate-shaped core; and said plate-shaped core together with said electromagnetic coil being mounted adjacent to the evacuated processing space of the processing chamber and positioning the uniaxial magnetic field within the processing space in an orientation parallel to the surface of the substrate.

31. The thin-film processing electromagnet of claim 30 in which said pattern of effective magnetic mass is symmetric about said center of the plate-shaped core.

32. The thin-film processing electromagnet of claim 30 in which said plate-shaped core is composed of a plurality of materials including at least one magnetic material, and a proportion of the magnetic material within the plate-shaped core varies along an axis parallel to said winding planes.

33. The thin-film processing electromagnet of claim 32 in which a proportion of the magnetic material is greater near a periphery of said plate-shaped core than near a center of said plate-shaped core.

34. The thin-film processing electromagnet of claim 30 in which said plate-shaped core has a magnetic material thickness dimension between said winding planes that varies along said winding planes.

35. The thin-film processing electromagnet of claim 34 in which said magnetic material thickness dimension is greater near a periphery of said plate-shaped core than near a center of said plate-shaped core.

* * * * *